(12) United States Patent
Yang et al.

(10) Patent No.: US 8,026,157 B2
(45) Date of Patent: Sep. 27, 2011

(54) GAS MIXING METHOD REALIZED BY BACK DIFFUSION IN A PECVD SYSTEM WITH SHOWERHEAD

(75) Inventors: Xiesen Yang, Cupertino, CA (US); Yong-Kee Chae, Pleasanton, CA (US); Shuran Sheng, Sunnyvale, CA (US); Liwei Li, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 248 days.

(21) Appl. No.: 12/553,007

(22) Filed: Sep. 2, 2009

(65) Prior Publication Data
US 2011/0053356 A1    Mar. 3, 2011

(51) Int. Cl.
*H01L 21/205* (2006.01)
*H05H 1/24* (2006.01)
(52) U.S. Cl. .......... 438/485; 438/488; 257/E21.17; 427/569
(58) Field of Classification Search ............ 438/485, 438/488, 482; 427/569, 574, 255.28; 257/E21.17
See application file for complete search history.

(56) References Cited

U.S. PATENT DOCUMENTS

| 6,200,893 | B1 | 3/2001 | Sneh |
| 7,410,671 | B2 | 8/2008 | Sherman |
| 7,687,300 | B2* | 3/2010 | Chae et al. ............ 438/57 |
| 2005/0251990 | A1* | 11/2005 | Choi et al. ............ 29/558 |
| 2007/0284044 | A1* | 12/2007 | Matsumoto et al. ..... 156/345.29 |
| 2007/0298590 | A1 | 12/2007 | Choi et al. |
| 2010/0104772 | A1* | 4/2010 | Kudela et al. ............ 427/569 |

\* cited by examiner

*Primary Examiner* — Michael Trinh
(74) *Attorney, Agent, or Firm* — Patterson & Sheridan, L.L.P.

(57) ABSTRACT

Embodiments of the present invention generally relate to methods of forming a microcrystalline silicon layer on a substrate in a deposition chamber. In, one embodiment, the method includes flowing a processing gas into a diffuser region between a backing plate and a showerhead of the deposition chamber, flowing the processing gas through a plurality of holes in the showerhead and into a process volume between the showerhead and a substrate support in the deposition chamber, igniting a plasma in the process volume, back-flowing gas ions formed in the plasma through the plurality of holes in the showerhead and into the diffuser region, mixing the gas ions and the processing gas in the diffuser region, re-flowing the gas ions and processing gas through the plurality of holes in the showerhead and into the process volume, and depositing a microcrystalline silicon layer on the substrate.

20 Claims, 16 Drawing Sheets

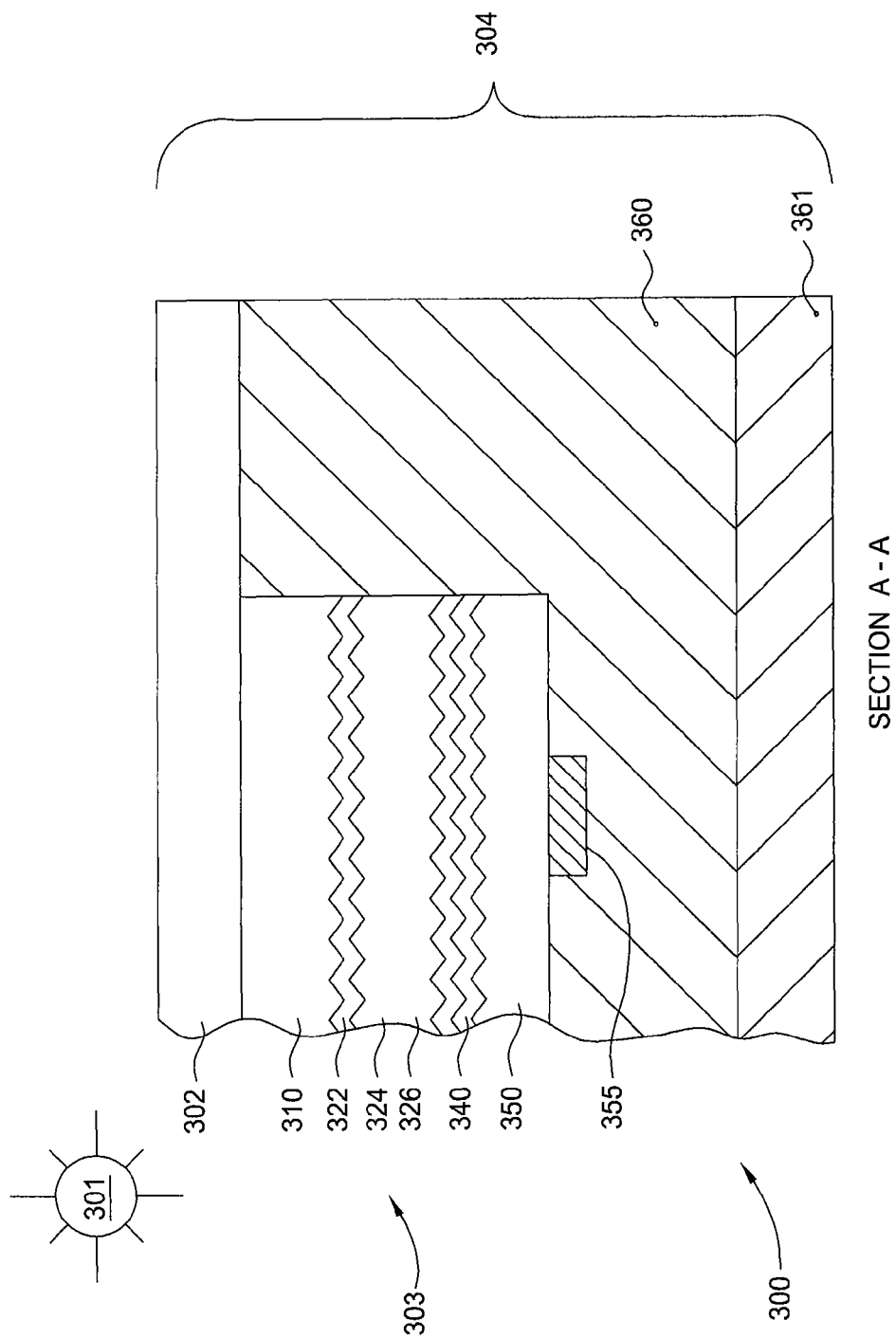

| | | | | | |
|---|---|---|---|---|---|
| | | | | 4.00 | 3.59 |
| | | | | 1.00 | 4.00 |
| | | | 0.30 | 0.35 | |
| | | | 0.29 | 0.31 | |
| | | 0.22 | 0.25 | | |
| | 0.57 | 0.30 | | | |
| | 0.42 | 0.40 | | | |
| 0.31 | 0.39 | | | | |
| 0.37 | 0.32 | | | | |
| 4.39 | 0.58 | | | | |

FIG. 6B

|      |      |      |      |      |      |      |      |      |      |
| ---- | ---- | ---- | ---- | ---- | ---- | ---- | ---- | ---- | ---- |
| 5.48 |      |      |      |      |      |      |      |      |      |
| 4.45 | 2.44 | 0.41 |      |      |      |      |      |      |      |
|      | 0.46 | 0.43 | 0.32 | 0.29 |      |      |      |      |      |
|      |      |      | 0.42 | 0.23 | 0.27 | 0.23 | 0.29 |      |      |
|      |      |      |      |      |      | 0.34 | 0.40 | 5.00 | 5.14 |
|      |      |      |      |      |      |      |      | 5.14 | 5.93 |

GAS MIXING METHOD REALIZED BY BACK DIFFUSION IN A PECVD SYSTEM WITH SHOWERHEAD

CROSS-REFERENCE TO RELATED APPLICATIONS

This application is related to U.S. application Ser. No. 12/202,199, filed Aug. 29, 2008, U.S. application Ser. No. 12/201,840, filed Aug. 29, 2008, and U.S. application Ser. No. 11/426,127, filed Jun. 23, 2006.

BACKGROUND OF THE INVENTION

1. Field of the Invention

Embodiments of the present invention generally relate to thin-film formation, such as for solar cells, and methods for forming thin-films. More particularly, embodiments of the present invention relate to methods of forming an intrinsic-type silicon layer having mixed silicon phases formed in thin-film and crystalline solar cells.

2. Description of the Related Art

Photovoltaic (PV) devices or solar cells are devices which convert sunlight into direct current (DC) electrical power. Crystalline silicon solar cells and thin-film solar cells are two types of solar cells. Crystalline silicon solar cells typically use either mono-crystalline substrates (i.e., single-crystal substrates of pure silicon) or multi-crystalline silicon substrates (i.e., poly-crystalline or polysilicon). Additional film layers are deposited onto the silicon substrates to improve light capture, form the electrical circuits, and protect the devices. Thin-film solar cells use thin layers of materials deposited on suitable substrates to form one or more p-n junctions. Suitable substrates include glass, metal, and polymer substrates.

Typically, a thin-film solar cell includes active regions, or photoelectric conversion units, and a transparent conductive oxide (TCO) film disposed as a front electrode and/or as a backside electrode. The photoelectric conversion unit includes a p-type silicon layer, an n-type silicon layer, and an intrinsic-type (i-type) silicon layer sandwiched between the p-type and n-type silicon layers. Several types of silicon films, including microcrystalline silicon film (pc-Si), amorphous silicon film (a-Si), polycrystalline silicon film (poly-Si), and the like, may be utilized to form the p-type, n-type, and/or i-type layers of the photoelectric conversion unit. The backside electrode may contain one or more conductive layers. When the photoelectric conversion unit of the solar cell is exposed to sunlight (consisting of energy from photons), the sunlight is converted to electricity through the PV effect.

Thin-film solar cells are generally formed from numerous types of films, or layers, put together in many different ways. Most films used in such devices incorporate a semiconductor element that may comprise silicon, germanium, carbon, boron, phosphorous, nitrogen, oxygen, hydrogen, and the like. Characteristics of the different films include degrees of crystallinity, dopant type, dopant concentration, film refractive index, film extinction coefficient, film transparency, film absorption, conductivity, thickness, and roughness. Most of these films can be formed by use of a chemical vapor deposition process, which may include some degree of ionization or plasma formation.

Insufficient crystallinity of the silicon film for layers that should be microcrystalline or polycrystalline may cause incomplete formation and fraction of the film, thereby reducing the conversion efficiency in a PV solar cell. Additionally, conventional deposition processes of microcrystalline silicon film have slow deposition rates, which disadvantageously reduce manufacturing throughput and increase production costs.

To expand the economic use of solar cells, efficiency must be improved both in the solar cells themselves and in the processes used to manufacture solar cells. With the increase of energy cost as well as environmental concerns, there is a need for more efficient thin-film solar cells and more efficient formation of thin-films in solar cells.

Therefore, there is a need for an improved method for depositing a microcrystalline silicon film.

SUMMARY OF THE INVENTION

In one embodiment of the present invention, a method of forming a microcrystalline silicon layer on a substrate in a deposition chamber is provided. The method includes flowing a processing gas into a diffuser region between a backing plate and a showerhead of the deposition chamber, flowing the processing gas through a plurality of holes in the showerhead and into a process volume between the showerhead and a substrate support in the deposition chamber, igniting a plasma in the process volume, back-flowing gas ions formed in the plasma through the plurality of holes in the showerhead and into the diffuser region, mixing the gas ions and the processing gas in the diffuser region, re-flowing the gas ions and processing gas through the plurality of holes in the showerhead and into the process volume, and depositing a microcrystalline silicon layer on the substrate.

In another embodiment of the invention, a method of forming a microcrystalline silicon layer on a substrate in a deposition chamber is provided. The method includes flowing a silane gas into a diffuser region between a backing plate and a showerhead of the deposition chamber, flowing the silane gas through a plurality of holes in the showerhead and into a process volume between the showerhead and a substrate support in the deposition chamber, igniting a plasma in the process volume, and cycling the flow of silane gas. Cycling the flow includes flowing the silane gas for between about 1 and 15 seconds after igniting the plasma and back-flowing gas ions formed in the plasma through the plurality of holes in the showerhead and into the diffuser region by stopping the flow of silane gas for between about 50 and 65 seconds. The method also includes mixing the gas ions and the silane gas in the diffuser region, re-flowing the gas ions and silane gas through the plurality of holes in the showerhead and into the process volume by repeating the cycle, and depositing a microcrystalline silicon layer on the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1D is a side cross-sectional view along Section A-A of FIG. 1C.

FIGS. 6A-6C illustrate results of silicon crystallinity test at various regions of substrates having silicon deposited on the substrate using pure silane.

DETAILED DESCRIPTION

Figure 1A:
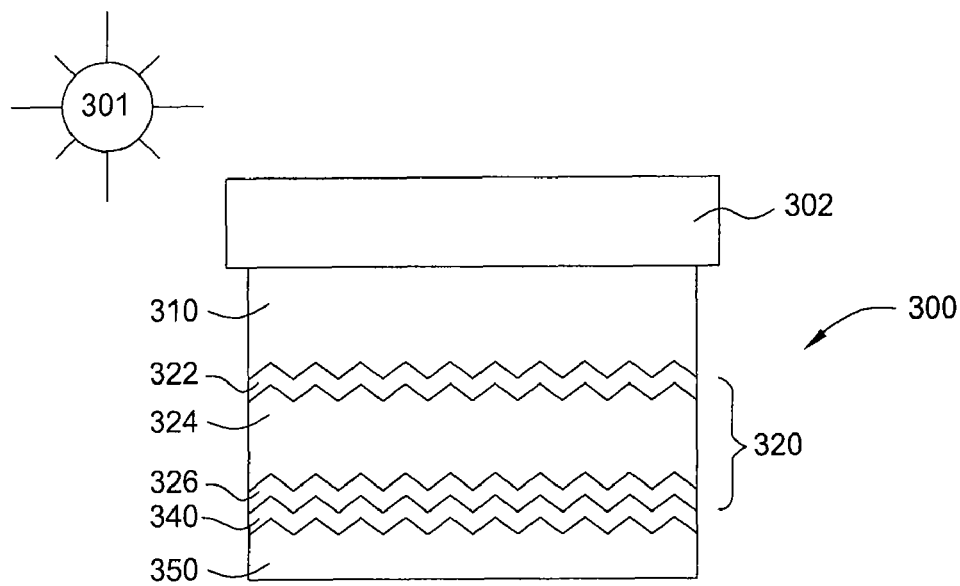
FIG. 1A is a side cross-sectional view of a thin-film solar cell device according to one embodiment described herein.

Photovoltaic cells, such as crystalline solar cells and thin-film solar cells, are generally formed from numerous types of films, or layers, put together in many different ways. Most films used in such devices incorporate a semiconductor element that may comprise silicon, germanium, carbon, boron, phosphorous, nitrogen, oxygen, hydrogen, and the like. Characteristics of the different films include degrees of crystallinity, dopant type, dopant concentration, film refractive index, film extinction coefficient, film transparency, film absorption, conductivity, thickness, and roughness. Many of these films may be formed by use of a chemical vapor deposition process, which may include some degree of gas ionization or plasma formation.

Charge generation during a photovoltaic process is generally provided by a bulk semiconductor layer, such as a silicon containing layer. The bulk layer is also sometimes called an intrinsic layer to distinguish it from the various doped layers present in the solar cell. The intrinsic layer may have any desired degree of crystallinity, which will influence its light-absorbing characteristics. For example, an amorphous intrinsic layer, such as amorphous silicon, will generally absorb light at different wavelengths compared to intrinsic layers having different degrees of crystallinity, such as microcrystalline or nanocrystalline silicon or polycrystalline. For this reason, it may be advantageous to use various types of layers to yield the broadest possible absorption characteristics.

Silicon and other semiconductors can be formed into solids having varying degrees of crystallinity. Solids having essentially no crystallinity are amorphous, and silicon with negligible crystallinity is referred to as amorphous silicon. Completely crystalline silicon is referred to as crystalline, polycrystalline, or monocrystalline silicon. Polycrystalline silicon is crystalline silicon including numerous crystal grains separated by grain boundaries. Monocrystalline silicon is a single crystal of silicon. Solids having partial crystallinity, that is a crystal fraction between about 5% and about 95%, are referred to as nanocrystalline or microcrystalline, generally referring to the size of crystal grains suspended in an amorphous phase. Solids having larger crystal grains are referred to as microcrystalline, whereas those with smaller crystal grains are nanocrystalline. It should be noted that the term "crystalline silicon" may refer to any form of silicon having a crystal phase, including microcrystalline, nanocrystalline, monocrystalline, and polycrystalline silicon.

Embodiments of the present invention generally relate to a method used to form microcrystalline films or layers on solar cell devices using processing modules adapted to perform one or more processes in the formation of the solar cell devices within a system of forming solar cell devices. In one embodiment, the method is used to form microcrystalline layers on thin-film solar cell devices within a fully automated production line that accepts large unprocessed substrates and performs multiple deposition, material removal, cleaning, sectioning, bonding, and various inspection and testing processes to form multiple complete, functional, and tested solar cell devices that can then be shipped to an end user for installation in a desired location to generate electricity.

Some examples of a solar cell 300 that can be formed using the various process sequences, such as those sequences disclosed in U.S. application Ser. No. 12/202,199, filed Aug. 29, 2008 and U.S. application Ser. No. 12/201,840, filed Aug. 29, 2008, are illustrated in FIGS. 1A-1E. FIG. 1A is a simplified schematic diagram of a single-junction amorphous or microcrystalline silicon solar cell 300 that can be formed and analyzed in the system described below. As shown in FIG. 1A, the single-junction amorphous or microcrystalline silicon solar cell 300 is oriented toward a light source or solar radiation 301. The solar cell 300 generally comprises a substrate 302, such as a glass substrate, polymer substrate, metal substrate, or other suitable substrate, with thin-films formed thereover. In one embodiment, the substrate 302 is a glass substrate that is about 2200 mm×2600 mm×3 mm in size. The solar cell 300 further comprises a first transparent conducting oxide (TCO) layer 310 (e.g., zinc oxide (ZnO), tin oxide (SnO)) formed over the substrate 302, a first p-i-n junction 320 formed over the first TCO layer 310, a second TCO layer 340 formed over the first p-i-n junction 320, and a back contact layer 350 formed over the second TCO layer 340. To improve light absorption by enhancing light trapping, the substrate and/or one or more of the thin-films formed thereover may be optionally textured by wet, plasma, ion, and/or mechanical processes. For example, in the embodiment shown in FIG. 1A, the first TCO layer 310 is textured, and the subsequent thin-films deposited thereover generally follow the topography of the surface below it. In one configuration, the first p-i-n junction 320 may comprise a p-type amorphous silicon layer 322, an intrinsic-type amorphous silicon layer 324 formed over the p-type amorphous silicon layer 322, and an n-type amorphous silicon layer 326 formed over the intrinsic-type amorphous silicon layer 324. In one example, the p-type amorphous silicon layer 322 may be formed to a thickness between about 60 Å and about 300 Å, the intrinsic-type amorphous silicon layer 324 may be formed to a thickness between about 1,500 Å and about 3,500 Å, and the n-type amorphous semiconductor layer 326 may be formed to a thickness between about 100 Å and about 500 Å. The back contact layer 350 may include, but is not limited to a material selected from the group consisting of Al, Ag, Ti, Cr, Au, Cu, Pt, alloys thereof, and combinations thereof.

Figure 1B:
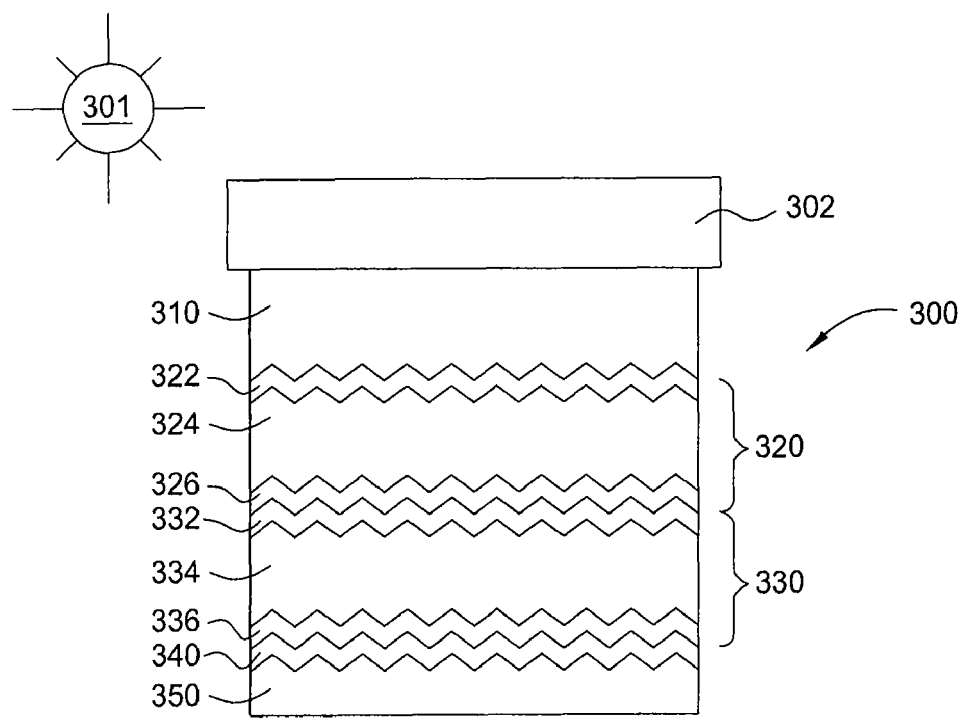
FIG. 1B is a side cross-sectional view of a thin-film solar cell device according to one embodiment described herein.

FIG. 1B is a schematic diagram of an embodiment of a solar cell 300, which is a multi-junction solar cell that is oriented toward the light or solar radiation 301. The solar cell 300 comprises a substrate 302, such as a glass substrate, polymer substrate, metal substrate, or other suitable substrate, with thin-films formed thereover. The solar cell 300 may further comprise a first transparent conducting oxide (TCO) layer 310 formed over the substrate 302, a first p-i-n junction 320 formed over the first TCO layer 310, a second p-i-n junction 330 formed over the first p-i-n junction 320, a second TCO layer 340 formed over the second p-i-n junction 330, and a back contact layer 350 formed over the second TCO layer 340. In the embodiment shown in FIG. 1B, the first TCO layer 310 is textured, and the subsequent thin-films deposited thereover generally follow the topography of the surface below it. The first p-i-n junction 320 may comprise a p-type amorphous silicon layer 322, an intrinsic-type amorphous silicon layer 324 formed over the p-type amorphous silicon layer 322, and an n-type microcrystalline silicon layer 326 formed over the intrinsic-type amorphous silicon layer 324. In one example, the p-type amorphous silicon layer 322 may be formed to a thickness between about 60 Å and about 300 Å, the intrinsic-type amorphous silicon layer 324 may be formed to a thickness between about 1,500 Å and about 3,500 Å, and the n-type microcrystalline semiconductor layer 326 may be formed to a thickness between about 100 Å and about 400 Å. The second p-i-n junction 330 may comprise a p-type microcrystalline silicon layer 332, an intrinsic-type microcrystalline silicon layer 334 formed over the p-type microcrystalline silicon layer 332, and an n-type amorphous silicon layer 336 formed over the intrinsic-type microcrystalline silicon layer 334. In one example, the p-type microcrystalline silicon layer 332 may be formed to a thickness between about 100 Å and about 400 Å, the intrinsic-type microcrystalline silicon layer 334 may be formed to a thickness between about 10,000 Å and about 30,000 Å, and the n-type amorphous silicon layer 336 may be formed to a thickness between about 100 Å and about 500 Å. The back contact layer 350 may include, but is not limited to, a material selected from the group consisting of Al, Ag, Ti, Cr, Au, Cu, Pt, alloys thereof, and combinations thereof.

Figure 1C:
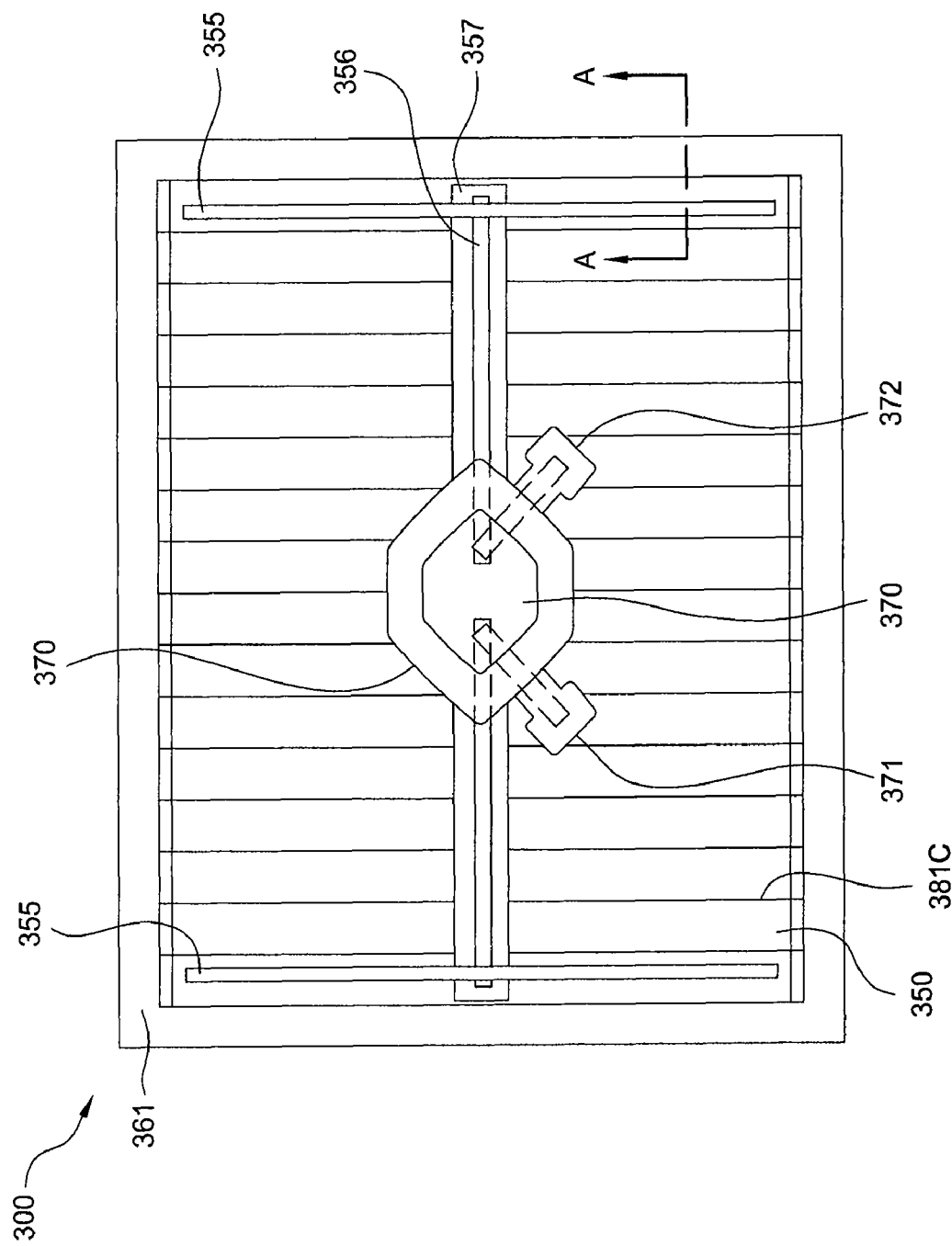
FIG. 1C is a plan view of a composite solar cell structure according to one embodiment described herein.

FIG. 1C is a plan view that schematically illustrates an example of the rear surface of a formed solar cell 300 that has been produced in the production line 200. FIG. 1D is a side cross-sectional view of portion of the solar cell 300 illustrated in FIG. 1C (see section A-A). While FIG. 1D illustrates the cross-section of a single-junction cell similar to the configuration described in FIG. 1A, this is not intended to be limiting as to the scope of the invention described herein.

As shown in FIGS. 1C and 1D, the solar cell 300 may contain a substrate 302, the solar cell device elements (e.g., reference numerals 310-350), one or more internal electrical connections (e.g., side buss 355, cross-buss 356), a layer of bonding material 360, a back glass substrate 361, and a junction box 370. The junction box 370 may generally contain two connection points 371, 372 that are electrically connected to portions of the solar cell 300 through the side buss 355 and the cross-buss 356, which are in electrical communication with the back contact layer 350 and active regions of the solar cell 300. To avoid confusion relating to the actions specifically performed on the substrates 302 in the discussion below, a substrate 302 having one or more of the deposited layers (e.g., reference numerals 310-350) and/or one or more internal electrical connections (e.g., side buss 355, cross-buss 356) disposed thereon is generally referred to as a device substrate 303. Similarly, a device substrate 303 that has been bonded to a back glass substrate 361 using a layer of bonding material 360 is referred to as a composite solar cell structure 304.

Figure 1E:
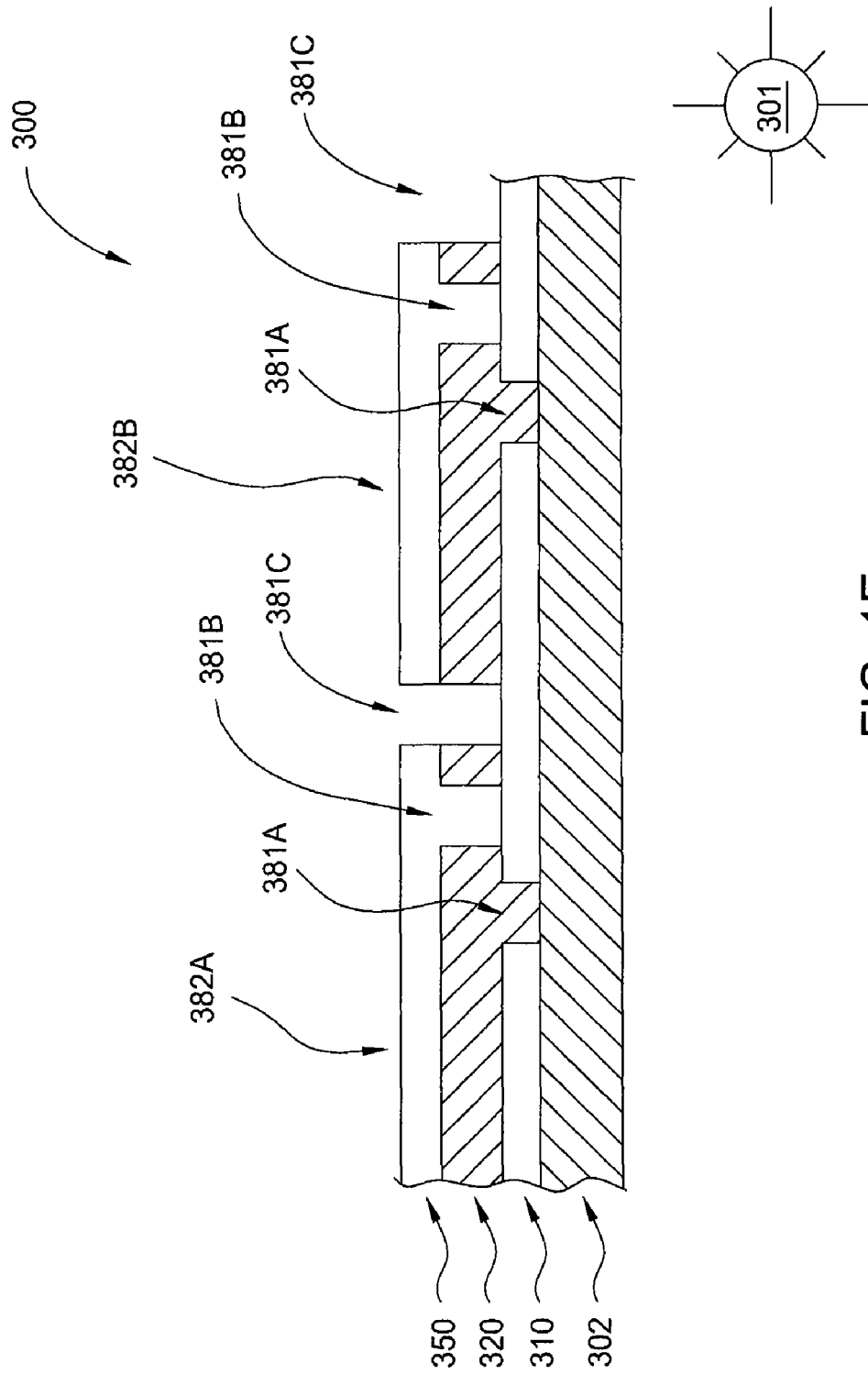
FIG. 1E is a side cross-sectional view of a thin-film solar cell device according to one embodiment described herein.

FIG. 1E is a schematic cross-section of a solar cell 300 illustrating various scribed regions used to form the individual cells 382A-382B within the solar cell 300. As illustrated in FIG. 1E, the solar cell 300 includes a transparent substrate 302, a first TCO layer 310, a first p-i-n junction 320, and a back contact layer 350. Three laser scribing steps may be performed to produce trenches 381A, 381B, and 381C, which are generally required to form a high-efficiency solar cell device. Although formed together on the substrate 302, the individual cells 382A and 382B are isolated from each other by the insulating trench 381C formed in the back contact layer 350 and the first p-i-n junction 320. In addition, the trench 381B is formed in the first p-i-n junction 320 so that the back contact layer 350 is in electrical contact with the first TCO layer 310. In one embodiment, the insulating trench 381A is formed by the laser scribe removal of a portion of the first TCO layer 310 prior to the deposition of the first p-i-n junction 320 and the back contact layer 350. Similarly, in one embodiment, the trench 381B is formed in the first p-i-n junction 320 by the laser scribe removal of a portion of the first p-i-n junction 320 prior to the deposition of the back contact layer 350. While a single-junction type solar cell is illustrated in FIG. 1E this configuration is not intended to be limiting to the scope of the invention described herein.

Photoabsorber Deposition Processing Module(s) and Processing Sequence

Figure 2A:
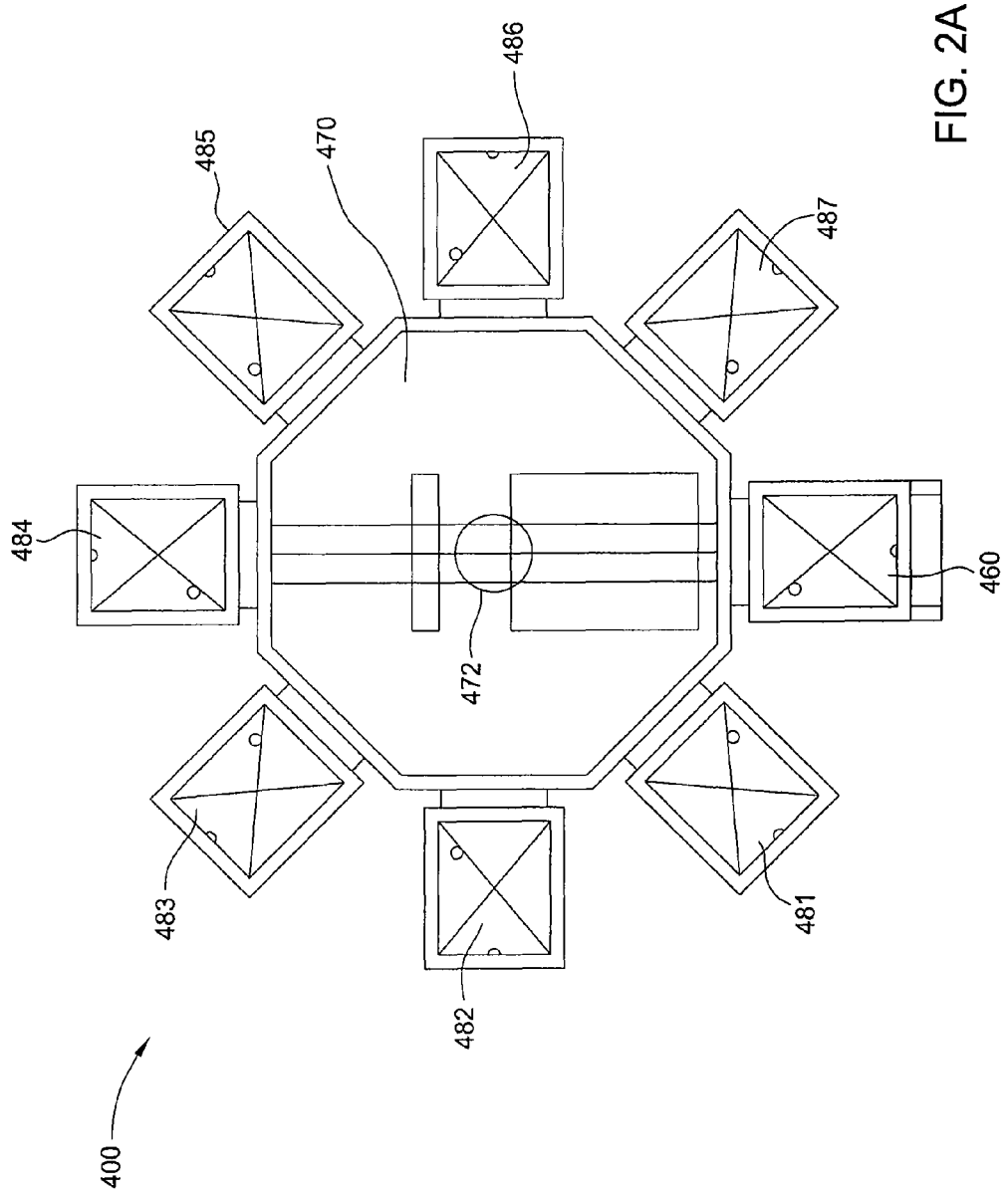
FIG. 2A illustrates a plan view of a cluster tool that may be used according to one embodiment described herein.
Figure 2B:
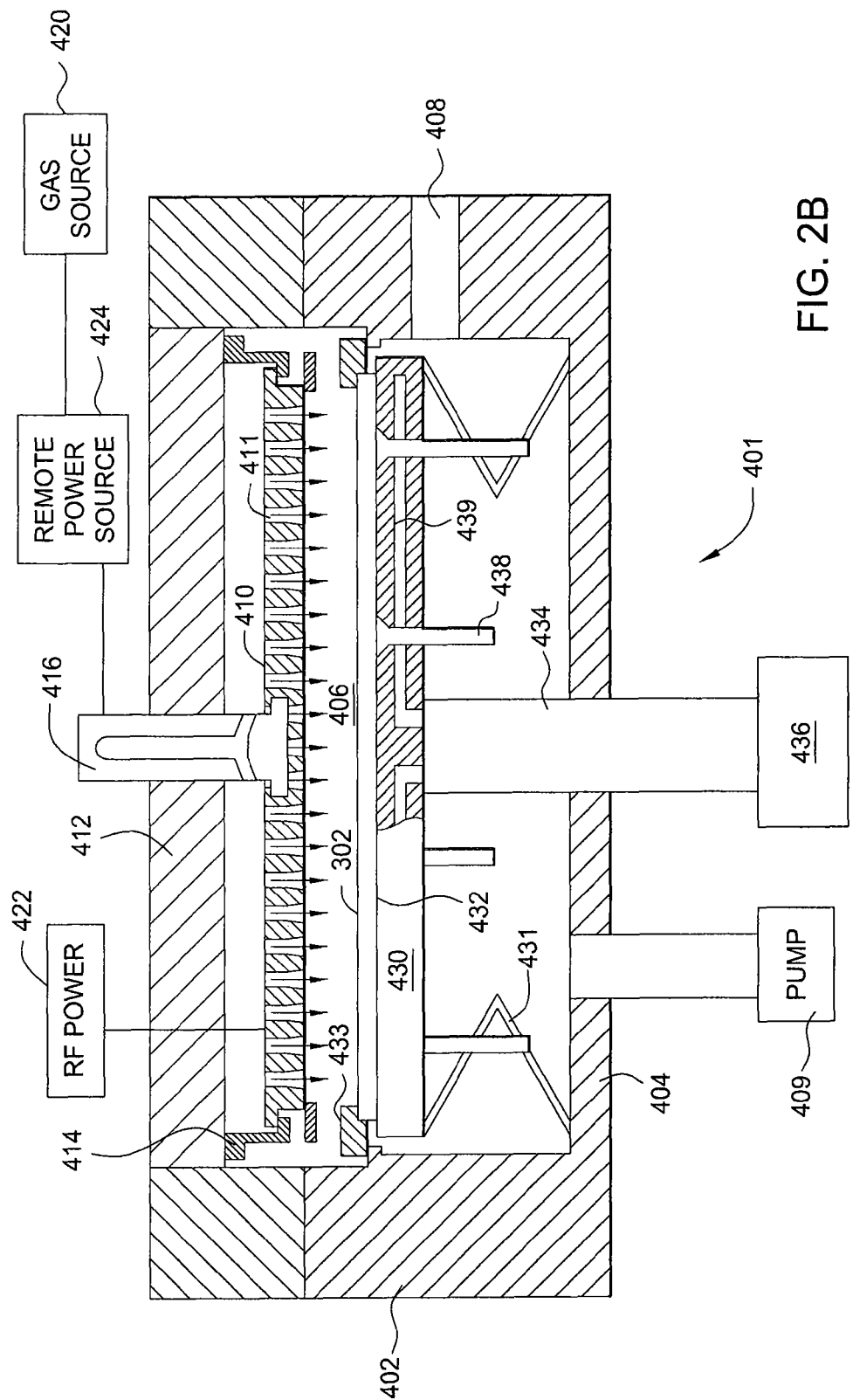
FIG. 2B is a side cross-sectional view of a deposition chamber according to one embodiment described herein.

FIGS. 2A-2B illustrate a processing system 400 and a deposition chamber 401 that may be used to form a portion of the solar cell 300, discussed above. FIG. 2A is a top schematic view of one embodiment of a processing system 400, which may be one of the one or more cluster tools used in forming photovolataic cells in an automatic manufacturing system. The processing system 400 can thus be used to perform one or more processing steps that are used to form the various regions of the solar cell device. The processing system 400 will generally contain a plurality of process chambers 481-487, such as a plasma enhanced chemical vapor deposition (PECVD) chamber 401 (FIG. 2B), capable of depositing one or more desired layers on the substrate surface. The process system 400 includes a transfer chamber 470 coupled to a load lock chamber 460 and the process chambers 481-487. The load lock chamber 460 allows substrates to be transferred between the ambient environment outside the system and vacuum environment within the transfer chamber 470 and process chambers 481-487. The load lock chamber 460 includes one or more evacuatable regions holding one or more substrates. The evacuatable regions are pumped down during input of substrates into the system 400 and are vented during output of the substrates from the system 400. The transfer chamber 470 has at least one vacuum robot 472 disposed therein that is adapted to transfer substrates between the load lock chamber 460 and the process chambers 481-487. While seven process chambers are shown in FIG. 2A, the system 400 may have any suitable number of process chambers.

FIG. 2B is a schematic cross-section view of one embodiment of a deposition chamber, such as a PECVD chamber 401 in which one or more films of a solar cell 300 may be deposited. One suitable plasma enhanced chemical vapor deposition chamber is available from Applied Materials, Inc., located in Santa Clara, Calif. It is contemplated that other deposition chambers, such as hot wire chemical vapor deposition (HWCVD), low pressure chemical vapor deposition (LPCVD), physical vapor deposition (PVD), evaporation, or other similar devices, including those from other manufacturers, may be utilized to practice the present invention. In one embodiment, the chamber 401 generally includes walls 402, a bottom 404, and a showerhead 410, and substrate support 430 which define a process volume 406. The process volume is accessed through a valve 408 such that the substrate, such as substrate 302, may be transferred in and out of the PECVD chamber 401.

The substrate support 430 includes a substrate receiving surface 432 for supporting a substrate and stem 434 coupled to a lift system 436 to raise and lower the substrate support 430. A shadow frame 433 may be optionally placed over periphery of the device substrate 303 that may already have one or more layers formed thereon, for example, the TCO layer 310. Lift pins 438 are moveably disposed through the substrate support 430 to move a substrate to and from the substrate receiving surface 432. The substrate support 430 may also include heating and/or cooling elements 439 to maintain the substrate support 430 at a desired temperature. The substrate support 430 may also include grounding straps 431 to provide RF grounding at the periphery of the substrate support 430. Examples of grounding straps are disclosed in U.S. Pat. No. 6,024,044 issued on Feb. 15, 2000 to Law et al. and U.S. patent application Ser. No. 11/613,934 filed on Dec. 20, 2006 to Park et al., which are both incorporated by reference in their entirety to the extent not inconsistent with the present disclosure.

The showerhead 410 is coupled to a backing plate 412 at its periphery by a suspension 414. The showerhead 410 may also be coupled to the backing plate by one or more center supports 416 to help prevent sag and/or control the straightness/curvature of the showerhead 410. A gas source 420 is coupled to the backing plate 412 to provide gas through the backing plate 412 and through the plurality of holes 411 in the showerhead 410 to the substrate receiving surface 432. A vacuum pump 409 is coupled to the PECVD chamber 401 to control the process volume 406 at a desired pressure. An RF power source 422 is coupled to the backing plate 412 and/or to the showerhead 410 to provide an RF power to the showerhead 410 so that an electric field is created between the showerhead and the substrate support so that a plasma may be generated from the gases between the showerhead 410 and the substrate support 430. Various RF frequencies may be used, such as a frequency between about 0.3 MHz and about 200 MHz. In one embodiment the RF power source is provided at a frequency of 13.56 MHz. Examples of showerheads are disclosed in U.S. Pat. No. 6,477,980 issued on Nov. 12, 2002 to White et al., U.S. Publication 20050251990 published on Nov. 17, 2006 to Choi et al., and U.S. Publication 2006/0060138 published on Mar. 23, 2006 to Keller et al, which are all incorporated by reference in their entirety to the extent not inconsistent with the present disclosure.

A remote plasma source 424, such as an inductively coupled remote plasma source, may also be coupled between the gas source and the backing plate. Between processing substrates, a cleaning gas may be provided to the remote plasma source 424 so that a remote plasma is generated and provided to clean chamber components. The cleaning gas may be further excited by the RF power source 422 provided to the showerhead. Suitable cleaning gases include but are not limited to $NF_3$, $F_2$, and $SF_6$. Examples of remote plasma sources are disclosed in U.S. Pat. No. 5,788,778 issued Aug. 4, 1998 to Shang et al, which is incorporated by reference to the extent not inconsistent with the present disclosure.

Referring back to FIG. 2A, in one embodiment of the system 400, one of the process chambers 481-487 is configured to deposit a p-type silicon layer(s) of a first p-i-n junction 320 or a second p-i-n junction 330 of a solar cell device, another one of the process chambers 481-487 is configured to deposit an intrinsic silicon layer of the first or the second p-i-n junction, and another of the process chambers 481-487 is configured to deposit the n-type silicon layer(s) of the first or the second p-i-n junction. While a three-chamber process configuration may have some contamination control advantages, it will generally have a lower substrate throughput than a two-chamber processing system, and generally cannot maintain a desirable throughput when one or more of the processing chambers is brought down for maintenance.

In certain embodiments of the invention, the system 400 (FIG. 4) is configured to form a first p-i-n junction having an intrinsic-type amorphous silicon layer, such as the first p-i-n junction 320 illustrated in FIGS. 1A-1B. In one embodiment, one of the process chambers 481-487 is configured to deposit the p-type silicon layer(s) of the first p-i-n junction while the remaining process chambers 481-487 are each configured to deposit both the intrinsic-type amorphous silicon layer(s) and the n-type silicon layer(s) of the first p-i-n junction. In one embodiment, the intrinsic-type amorphous silicon layer(s) and the n-type silicon layer(s) of the first p-i-n junction 320 may be deposited in the same chamber without performing a passivation process, which is used to minimize cross-contamination between the deposited layers, in between the deposition steps. While the discussion of the processing system 400 and its components references its use in forming the various elements of the first p-i-n junction, this configuration is not intended to be limiting as to the scope of the invention described herein, since the processing system 400 could be adapted to form the first p-i-n junction, the second p-i-n junction, both the first and second p-i-n junctions, or other combinations thereof without deviating from the basic scope of the invention described herein.

In one example, in which the substrate processing sequence performed in a system configured similarly to the processing system 400, a substrate enters the processing system 400 through the load lock chamber 460, the substrate is then transferred by the vacuum robot 472 into the process chamber 481 that is configured to deposit a p-type silicon layer(s) on the substrate, after depositing the p-type layer in process chamber 481 the substrate is then transferred by the vacuum robot 472 into the process chamber 484 that is configured to deposit both the intrinsic-type silicon layer(s) and the n-type silicon layer(s), and then after depositing the intrinsic-type layer(s) and n-type layer(s) in process chamber 484, the substrate is returned to the load lock chamber 460 after which the substrate can be removed from the system. Assuming that the p-type layer is 150 Å in thickness and the deposition rate of 500 Å per minute, the period of time to deposit the p-type layer is approximately 0.3 minute. For an intrinsic layer of 2,700 Å at a deposition rate of 220 Å/min., the time period to deposit the intrinsic layer is approximately 12.3 minutes. Assuming an n-type layer of 250 Å at a deposition rate of 500 Å per minute it will require approximately 0.5 minute to deposit the n-type layer. It can therefore be seen that if one chamber is dedicated to deposition of a p-type layer and multiple chambers are dedicated to deposition of the intrinsic and n-type layers, an increased throughput of substrates can be realized by increasing the number of processing chambers that can produce the i-n layers in parallel. That is, a continuous series of substrates can be loaded and maneuvered by the transfer chamber 470 from a process chamber that is adapted to deposit a p-type layer, such as process chamber 481, and then transfer each of the substrates to at least one subsequent processing chamber, such as process chambers 482 through 487, to form the i-n layers.

In a two-chamber processing configuration, subsequent to deposition of the i-n layers in each of the chambers dedicated to producing the same, the process may be repeated. However, to preclude contamination being incorporated into the intrinsic layers formed on subsequent substrates, it has been found that performing a cleaning process, such as a seasoning process in each of the chambers dedicated to producing the i-type and n-type layers at some desired interval, the device yield of the processing sequence can be improved. The seasoning process may generally comprise one or more steps that are used to remove prior deposited material from a processing chamber part and one or more steps that are used to deposit a material on the processing chamber part as discussed in accordance with one of the embodiments described herein. An example of a seasoning process and solar cell processing sequence that may be used in one or more of the components in the processing module 212 is further described in U.S. patent application Ser. No. 12/170,387, filed Jul. 9, 2008, which is herein incorporated by reference.

In a conventional microcrystalline deposition process, processing gas, including a mixture of hydrogen ($H_2$) and silane ($SiH_4$), flows continuously through the showerhead 410 and into the process volume 406 and reacts in the plasma regime in the process volume 406. Thus, the gas component seeing the plasma is solely controlled by the supplied gas. Typically, this conventional process is carried out at lower pressures, such as between 1-3 Torr, to deposit microcrystalline silicon.

Using a processing gas of only silane without hydrogen tends to deposit a non-uniform microcrystalline film thickness. Additionally, sometimes a powder substance may be formed and contaminate both the chamber and the film layer. It is believed that the powder is a silicon powder that forms before the silicon ions reach the substrate surface, either because of too high of power or too high of pressure when using pure silane processing gas without hydrogen or a carrier gas. Large amounts of powder may be formed in the center region of a substrate when flowing pure silane under a high pressure condition. Thus, lower pressures may alleviate some of the powder generation problems, but also result in lower deposition rates. Additionally, if a mixture of hydrogen gas and silane gas is used, the production of powder is reduced.

Figure 3A:
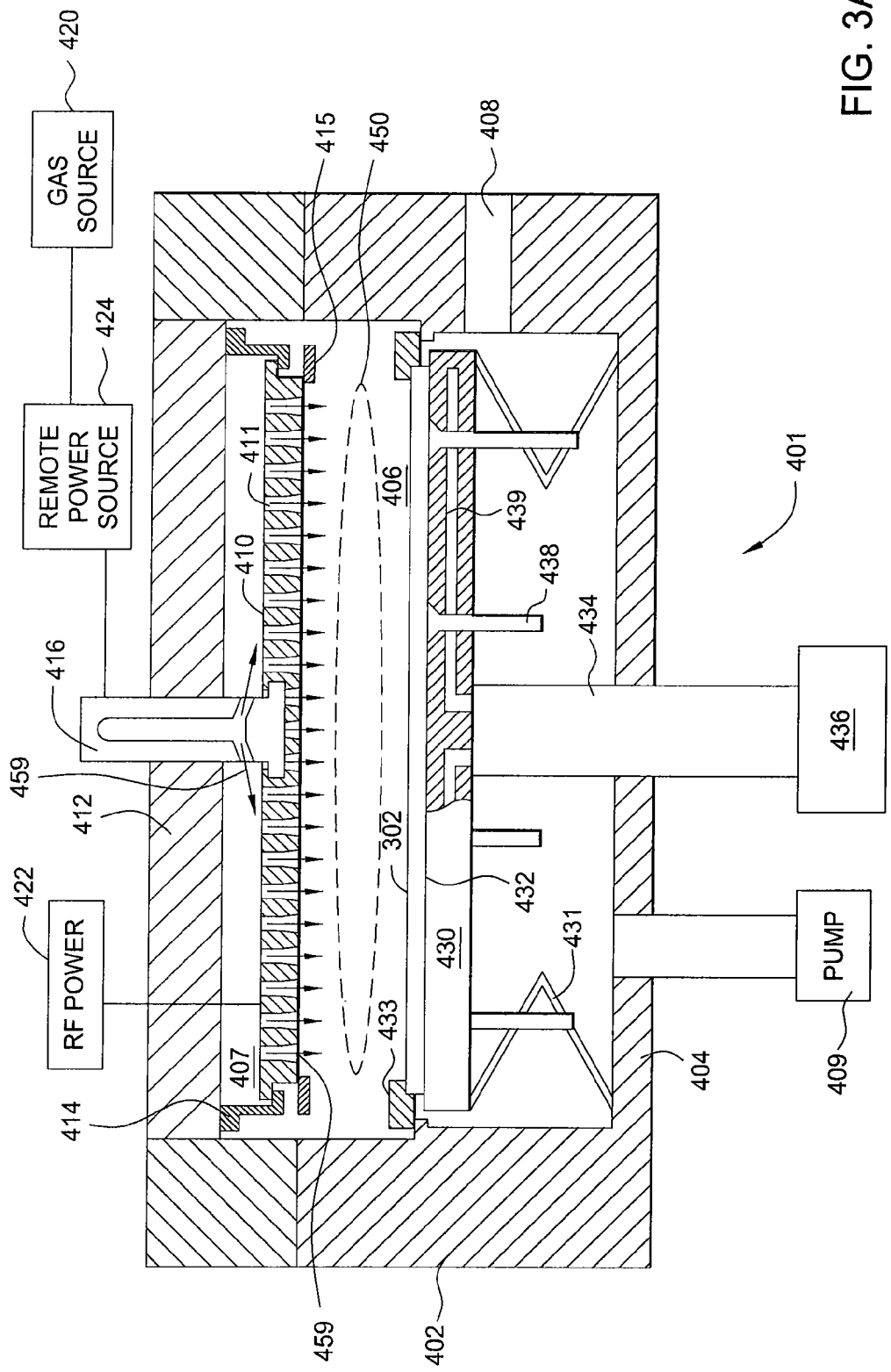
FIGS. 3A-3C illustrates a side cross-sectional view of a deposition chamber in FIG. 2B during processing according to one embodiment described herein.
Figure 3B:
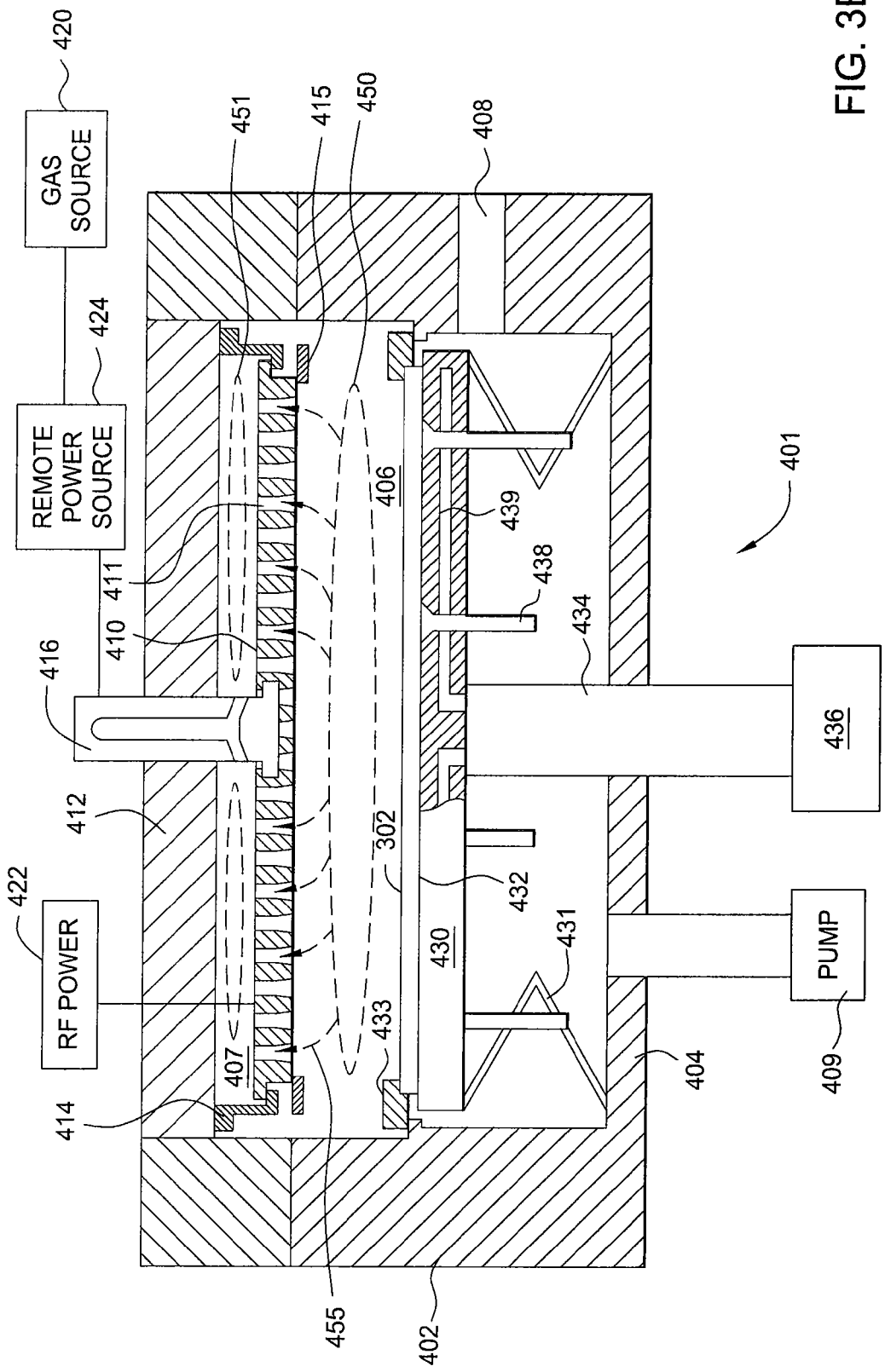
Figure 3C:
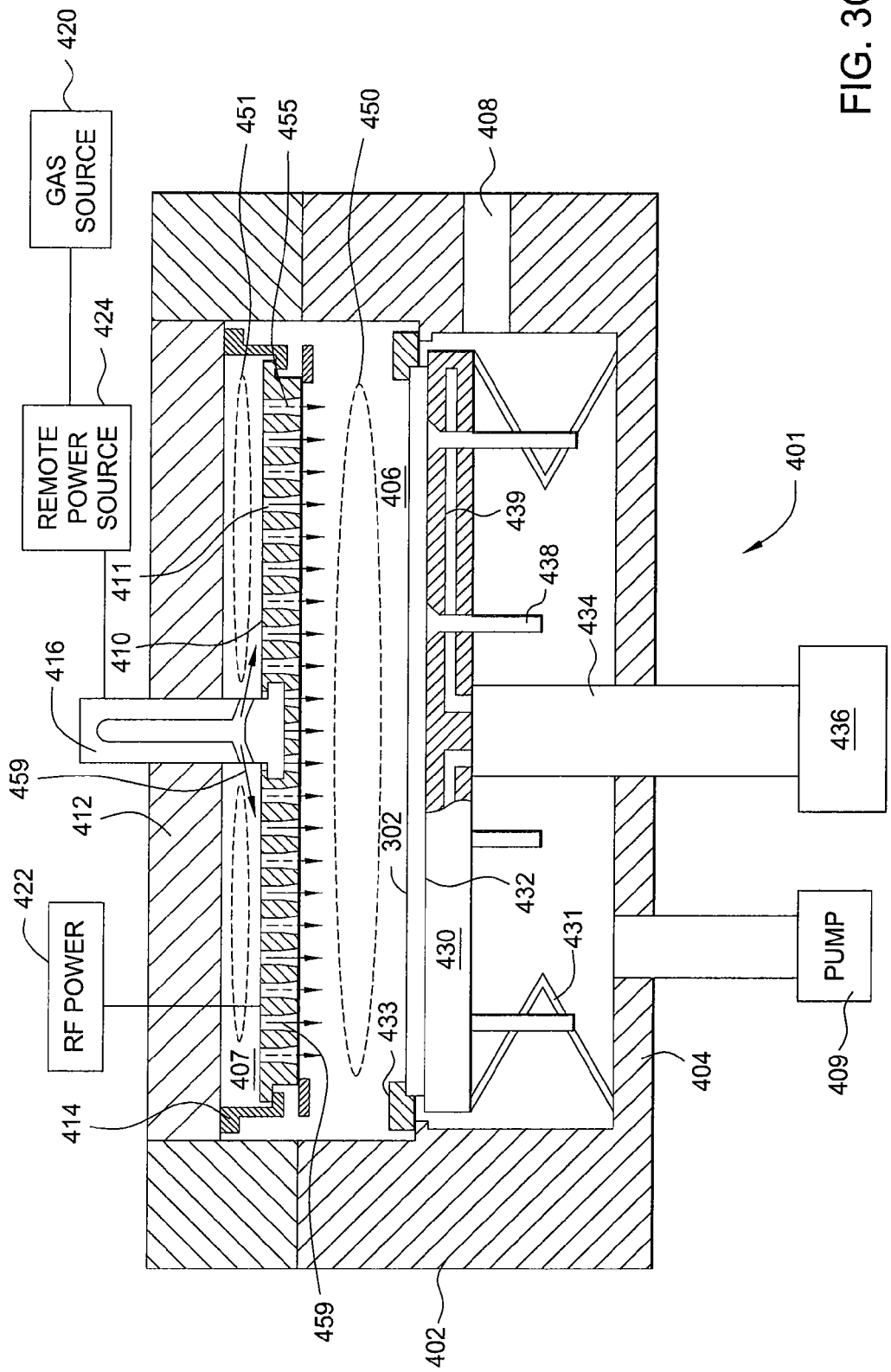
Figure 4:
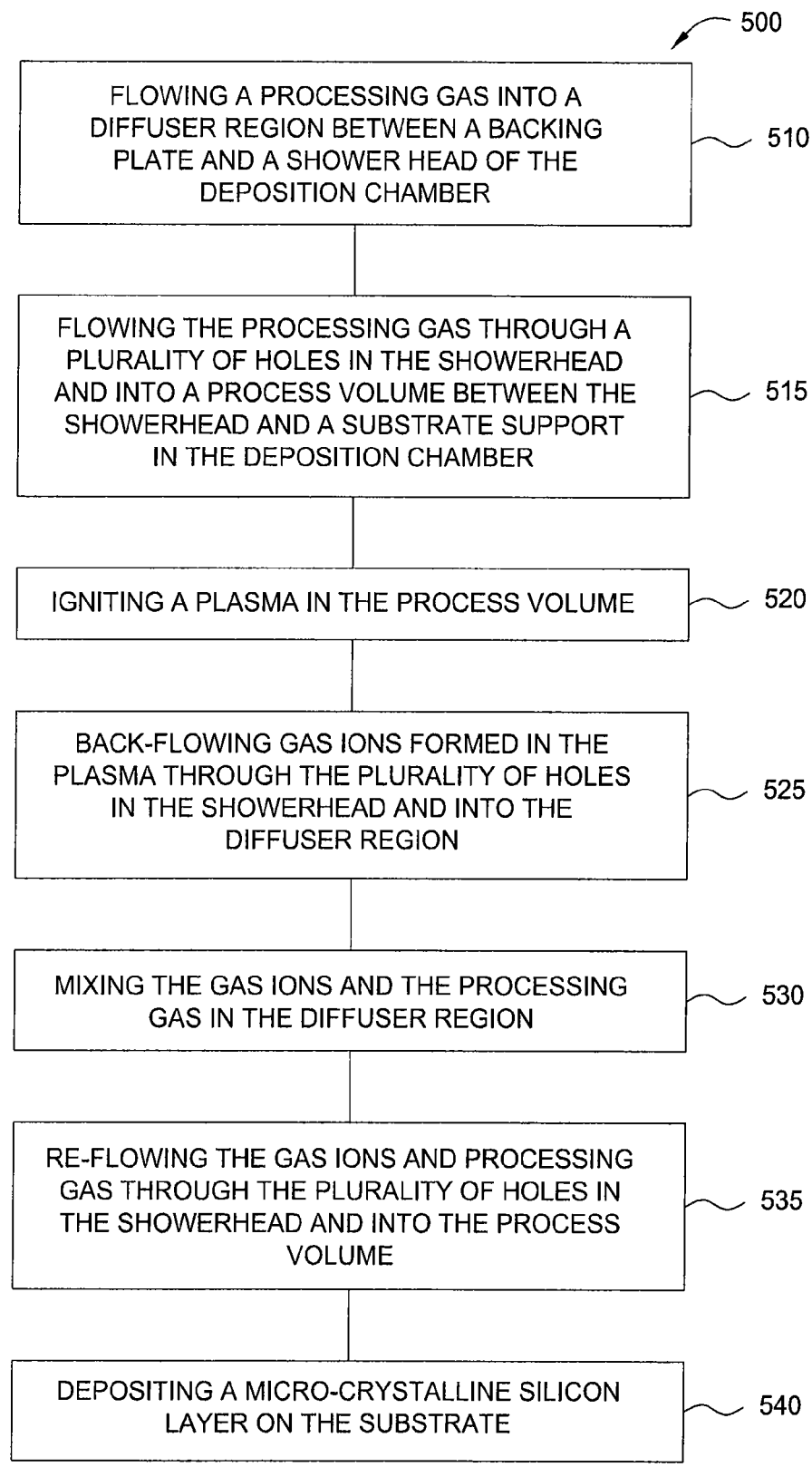
FIG. 4 illustrates a method of forming a microcrystalline silicon layer on a substrate in a deposition chamber according to one embodiment described herein.

However, using only silane as a processing gas without flowing hydrogen gas into the processing chamber during deposition of the microcrystalline silicon is desirable for various reasons. For example, using only silane saves on the cost of hydrogen gas use when mixed with the silane gas to form the processing gas, as hydrogen gas tends to be expensive. Additionally, the required pumping capacity for the processing gas is reduced without the need to flow hydrogen gas into the processing chamber during the deposition process. It is also believed that embodiments of the invention control the actual reaction gas composition itself, whereas the conventional silane/hydrogen processing gas mixture process controls the reaction gas composition with the various source gases, FIG. 4 illustrates one embodiment of a method 400 that contains a plurality of steps (i.e., steps 410-440) that are each used to form a microcrystalline layer on a substrate during formation of a solar cell device using a novel method described herein. The number of processing steps and order of the processing steps in the method 400 is not intended to be limiting to the scope of the invention described herein. FIG. 3A-3C are cross-sectional views of deposition chamber 401 during use of the method 400 according to one embodiment of the invention, which is intended to illustrate some of the processing steps, and is thus not intended to be limiting to the scope of the invention described herein.

Referring to FIGS. 3A-3C and FIG. 4, the method 500 for forming a microcrystalline silicon layer on a substrate in a processing chamber generally starts at box 502 by flowing a processing gas 459 into a diffuser region 407 between a backing plate 412 and a showerhead 410 of the deposition chamber 401. In one embodiment the processing gas 459 may comprise a silane-based gas and no carrier gas. Suitable examples of the silane-based gas include, but are not limited to, silane ($SiH_4$), di-silane ($Si_2H_6$), silicon tetrafluoride ($SiF_4$), silicon tetrachloride ($SiCl_4$), and dichlorsilane ($SiH_2Cl_2$), and the like. In another embodiment the processing gas may be a mixture of various gases, e.g., silane and hydrogen, and a carrier gas. In another embodiment, the processing gas consists of silane ($SiH_4$).

In the next box, 515, the processing gas 459 flows through a plurality of holes 411 in the showerhead 410 and into a process volume 406 between the showerhead 410 and a substrate support 430 in the deposition chamber 401. A plasma 450 is ignited in the process volume 406 in box 520 as shown in FIG. 3A. In one embodiment, the plasma may be ignited by applying an RF power to the deposition chamber at about 5000 W.

Turning to FIG. 3B, in the next step 525, the method continues by back-flowing gas ions formed in the plasma 450 through the plurality of holes 411 in the showerhead 410 and into the diffuser region 407. The dashed arrows 455 illustrate the gas ions formed in the plasma that flow back through the plurality of holes 411 filling the diffuser region 407 with gas ions as indicated by dashed area 451. It should be understood throughout this disclosure that a plasma is a partially ionized gas generally containing an equal number of positive and negative charges, as well as some other non-ionized gas particles, and is thus generally overall electrically neutral. Additionally, a plasma may generate various radicals. Thus, when using silane as a processing gas, various types of gas ions and radicals may be formed in the plasma, such as silane gas ions and radicals or hydrogen gas ions and radicals, and would back-flow into the diffuser region 407. Thus, gas ions and radicals formed in the plasma would back-flow into the diffuser region 407 which may include for example hydrogen ions and radicals, silicon ions and radicals, and silane ions and radicals.

In the next box 530, the gas ions 455 and the processing gas 459 are mixed in the diffuser region 407 followed by re-flowing the gas ions 455 and the processing gas 459 through the plurality of holes 411 in the showerhead 410 and into the process volume 406 as shown in box 535. By use of this method, a microcrystalline silicon layer is deposited on the substrate 402, as shown in box 540.

In one embodiment, the method 400, also includes cycling the flow of processing gas which includes flowing the processing gas for between about 1 and 15 seconds after igniting the plasma and then stopping the flow of processing gas for between about 50 and 65 seconds. For example, one cycle may be 60 seconds in duration which includes 10 seconds of processing gas flowing into the process region after igniting the plasma followed by stopping the flow of processing gas for 50 seconds. Other possible cycle time combinations may include flowing processing gas for 1 second and stopping for 50 seconds or flowing gas for 1 second and stopping for 61 seconds. The cycle may be repeated between 10 and 20 times. For example, in one embodiment, the cycle may include flowing the processing gas for 61 seconds and stopping the processing gas for 1 second, and repeating the cycle 15 times to deposit a uniform microcrystalline film on a substrate.

In one embodiment, back-flowing the gas ions formed in the plasma occurs during the portion of the cycle when the processing gas flow is stopped. It is believed, that by stopping the gas flow, the decreased pressure difference between the diffuser region 407 and the process volume 406 permits the gas ions 459 created by the plasma 450, to flow back through the plurality of holes 411 and into the diffuser region 407. Thus, back-flow of the gas ions into the diffuser region 407 may occur without completely stopping the processing gas flow. Rather, in another embodiment, the processing gas flow may simply be sufficiently decreased to allow the gas ions to back-flow through the plurality of holes 411 in the showerhead 410 by the resultant decreased pressure difference between the diffuser region 407 and the process volume 406.

Additionally, it is believed that after beginning and repeating the cycling process with a modulated processing gas flow, no processing gas reacts directly in the plasma, but reacts first with gas ions in the diffusion region 407 and then begins reacting with the plasma as the gas ions and processing gas mixture reenters the process volume 406. In another embodiment, the RF power is maintained at the same frequency and power level during the entire cycling time. The processing chamber may be pressurized between 6 and 10 torr and the flow rate of processing gas may be between 750 and 1300 standard cubic centimeters per minute (sccm). The pressure may be controlled by closing the pump port while flowing processing gas into the processing volume 406. If the pressure builds past a desired point, the pump port can be opened a little to keep pressure constant for a desired pumping of the process region 407.

In another embodiment, the method 500 includes initiating the deposition chamber 401 by flowing $H_2$ into the process volume 406. It may be desirable to initiate the reaction by flowing $H_2$ into the chamber to help continue the plasma reaction and deposition of microcrystalline silicon on the substrate. For example, the deposition chamber 401 may be initiated either before the first cycle or during the first cycle. In one embodiment, $H_2$ is flown into the process region without other processing gases, such as silane, for a period of time followed by beginning the cycle of flowing the processing gas into the process volume and stopping the flow of the processing gas into the process volume. In another embodiment, the first cycle may include flowing both $H_2$ and the processing gas into the process volume followed by stopping the flow of both $H_2$ and the processing gas into the process volume. However, when the cycle repeats the remaining times, only the process gas is flown into the process volume in embodiments where the process gas consists of only silane. The plasma may be ignited at any appropriate time for the particular process such as when the hydrogen alone flows into the chamber, then a mixture of hydrogen and processing gas flows into the chamber, or even after hydrogen alone is flown into the chamber but at the time the processing gas is flown into the chamber.

Figure 5:
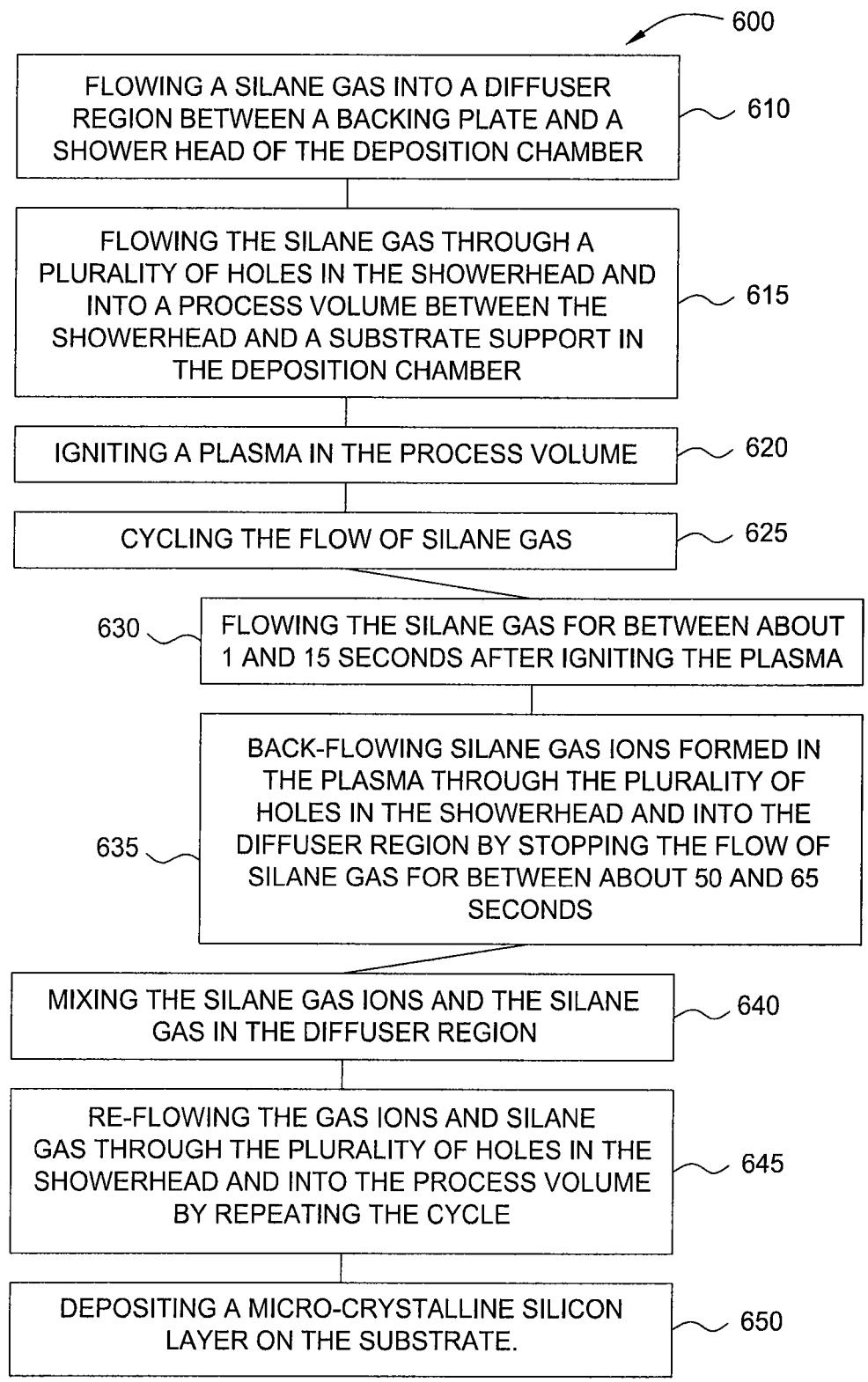
FIG. 5 illustrates another method of forming a microcrystalline silicon layer on a substrate in a deposition chamber according to another embodiment described herein.

FIG. 5 illustrates another embodiment of the method 600 for forming a microcrystalline silicon layer on a substrate in a processing chamber. The method 600 includes flowing a silane gas into a diffuser region between a backing plate and a showerhead of the deposition chamber, box 610, flowing the silane gas through a plurality of holes in the showerhead and into a process volume between the showerhead and a substrate support in the deposition chamber, box 615, igniting a plasma in the process volume, box 620, and cycling the flow of silane gas, box 625. Cycling the flow includes flowing the silane gas for between about 1 and 15 seconds after igniting the plasma, box 630, and back-flowing gas ions formed in the plasma through the plurality of holes in the showerhead and into the diffuser region by stopping the flow of silane gas for between about 50 and 65 seconds, box 635. The method also includes mixing the gas ions and the silane gas in the diffuser region, box 645, re-flowing the gas ions and silane gas through the plurality of holes in the showerhead and into the process volume by repeating the cycle, box 650, and depositing a microcrystalline silicon layer on the substrate, box 655.

Re-flowing the gas ions formed in the plasma back into the diffuser region and mixing with processing gas in the diffuser region changes the gas components that enter the process volume and the plasma area from a pure supplied gas to a mixture of processing gas and plasma-activated gas, e.g., gas ions. The PECVD process window is thereby modified and helps to prevent powder formation and to increase microcrystalline silicon film deposition and uniformity. Additionally, embodiments of the invention modify the pressure and pressure distribution in the diffuser region and thus modify the flow distribution in the process volume and plasma area to also increase film uniformity. Moreover, embodiments of the invention may make these improvements without requiring any hardware modifications.

In some conventional methods, the gas mixture used to deposit microcrystalline silicon have large ratios of silane-based gases to hydrogen ($H_2$), such as about 1:100 and even as high as 1:200. However, embodiments of the invention may form microcrystalline silicon using only silane-based gas as the processing gas without continuous flowing of hydrogen gas in the processing gas. In those embodiments, it should be noted that the deposition chamber may need to be initiated with a hydrogen gas injection, but that hydrogen gas is not used during subsequent cycling of the silane-based gas during the cycling steps of back-flowing the gas ions formed in the plasma, mixing them with the processing gas, and reflowing the mixture into the process volume and mixing with the plasma.

Following are various examples that show the improved crystallinity and uniformity when using embodiments of the invention compared to other processes.

Example 1

Table 1 shows various deposition parameters for a conventional-type method of forming microcrystalline silicon on a substrate. A 600×720 mm substrate is processed in a PECVD chamber, such as the AKT 4300 PECVD systems available from Applied Materials, Inc. In this conventional type method, pure silane was flown into the chamber without a carrier gas or hydrogen gas.

Each sample was placed in a chamber with a spacing of 640 millimeters between the showerhead and the substrate. The silane gas flow rate and pressures varied for each sample, as well as the power setting for forming the plasma. The deposition process was carried out at around 200° C. Each of the samples were processed for 600 seconds.

TABLE 1

| Sample | Flow (sccm) | Pressure (Torr) | Spacing (millimeters) | Power (W) |
|---|---|---|---|---|
| D-Si-x16 | 180 | 5 | 640 | 3000 |
| D-Si-x17 | 180 | 9 | 640 | 3000 |
| D-Si-x18 | 90 | 9 | 640 | 2000 |

Figure 6A:
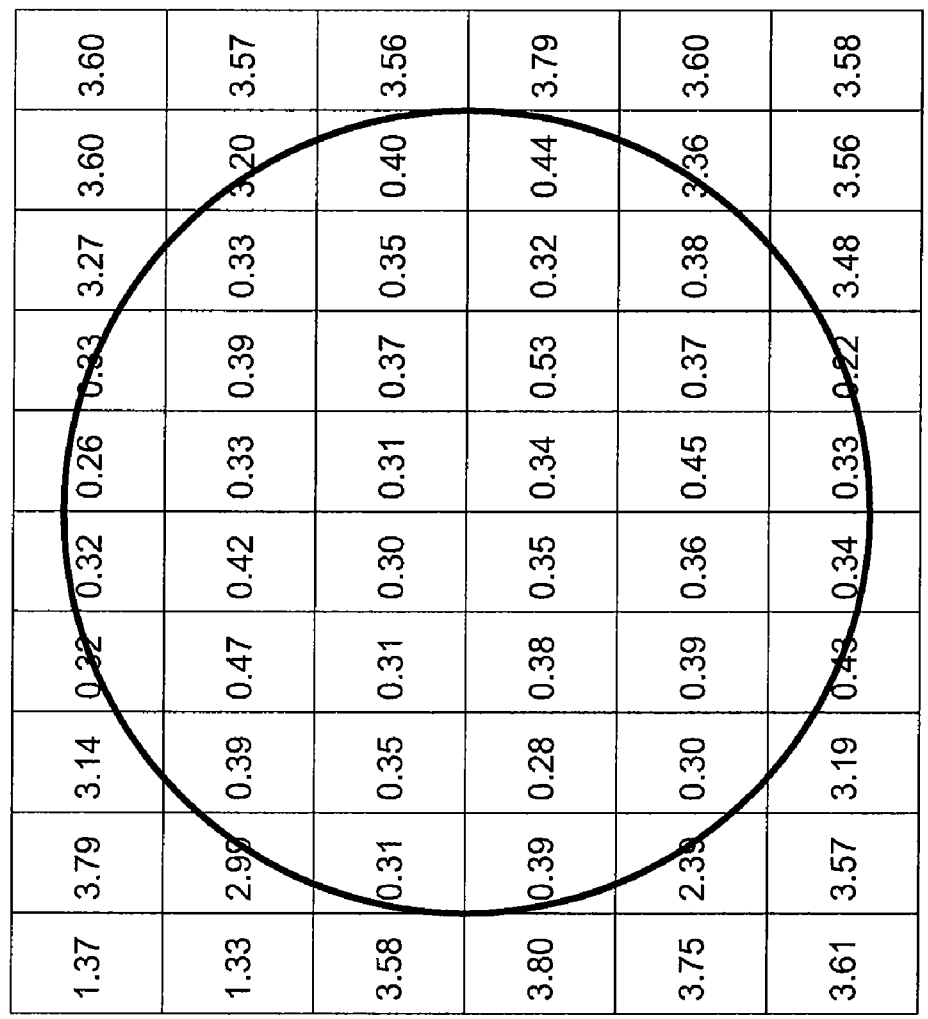

FIGS. 6A-6C illustrate the crystallinity test results from the various samples listed in and processed according to Table 1. 70×100 mm coupons from the 600×720 mm substrate where measured for crystallinity according to a ratio of crystalline silicon to amorphous silicon measured on the coupon where a ratio greater than 2.0 indicates microcrystalline silicon. Ratios lower than 2.0 indicate amorphous silicon formation. As is shown in FIG. 6A, the x16 sample had a largely amorphous silicon film formation over the central portion of the substrate that falls generally within the circled region. Additionally, lots of powder also formed in the center part of the substrate (within the circle). Microcrystalline silicon formed generally outside the circled region on the substrate with little or no powder on the edges and corners.

FIGS. 6B and 6C show the crystallinity test results for only a portion of the test sample substrates going in a generally diagonal direction. Again, amorphous silicon formed in largely the central portion of the substrate along with powder, whereas microcrystalline silicon formed generally along the edges and in the corners of the test sample substrates with little or no powder formation.

Example 2

Table 2 shows various deposition parameters according to embodiments of the invention for forming microcrystalline silicon on a substrate. Without a hardware change, various process parameters were changed along with performing the cycling of the process gas. A 600×720 mm substrate is processed in a PECVD chamber, such as the AKT 4300 PECVD systems available from Applied Materials, Inc. In the xy '908A5 sample, the pressure was maintained to be around 6-8 Torr, which was achieved by opening and closing the gate valve of the pump exhaust system. Additionally, the silane gas flow was increased to about 2500 sccm and flown into the chamber without a carrier gas. The power setting was increased to 5000 watts when striking a plasma. During the processing of each sample, the power remained on to maintain the plasma, The flow of silane into the chamber was cycled according to the parameters listed in Table 2. The silane gas was on for 5 seconds of a 60-second cycle. During the 55 seconds when the silane gas was off, the gas ions formed in the plasma would back-flow into the diffuser region of the chamber. When the next cycle begins with turning the silane gas flow back on, the silane process gas would mix with gas ions in the diffuser and the combined mixture would flow into the process volume in the plasma area. The cycle was repeated 15 times.

TABLE 2

| Sample | Flow (sccm) | Cycle Type (seconds gas flow on/total seconds) | Number of Cycles | Pressure (Torr) | Power (W) |
|---|---|---|---|---|---|
| xy-'908A5 | 2500 | 5"/60" | 15 | 6-8 | 5000 |
| D-Si-x42 | 1250 | 1"/61" | 15 | 6-8 | 5000 |
| D-Si-x43 | 800 | 1"/61" | 15 | 6-8 | 5000 |
| D-Si-x44 | 1000 | 1"/50" | 15 | 6-8 | 5000 |

Figure 7A:
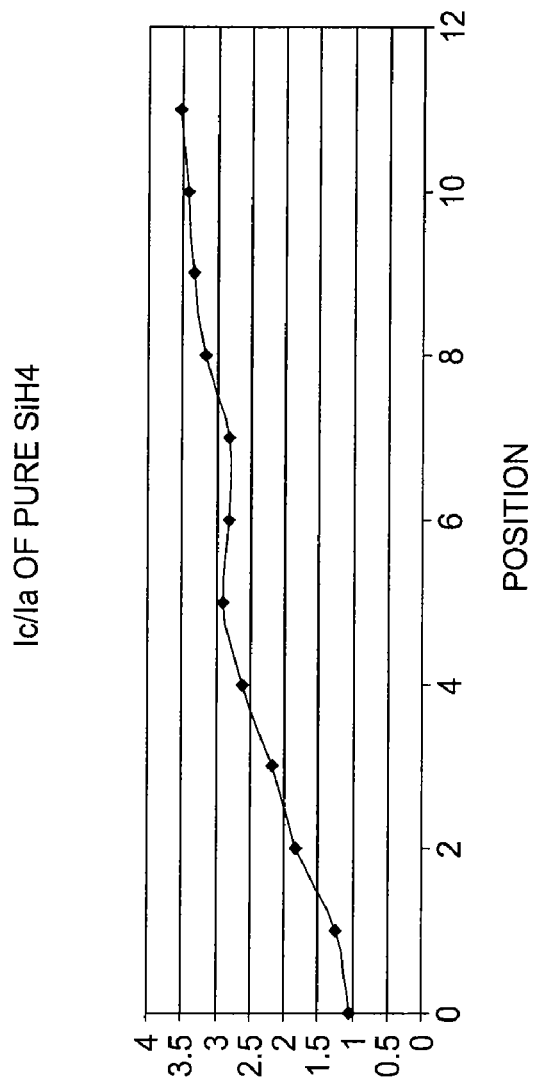
FIGS. 7A-7C illustrate results of silicon crystallinity tests at various regions of substrates having silicon deposited on the substrate according to embodiments of the invention.
Figure 7B:
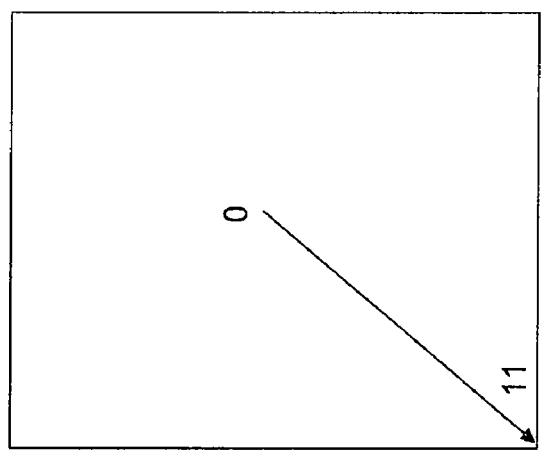
Figure 7C:
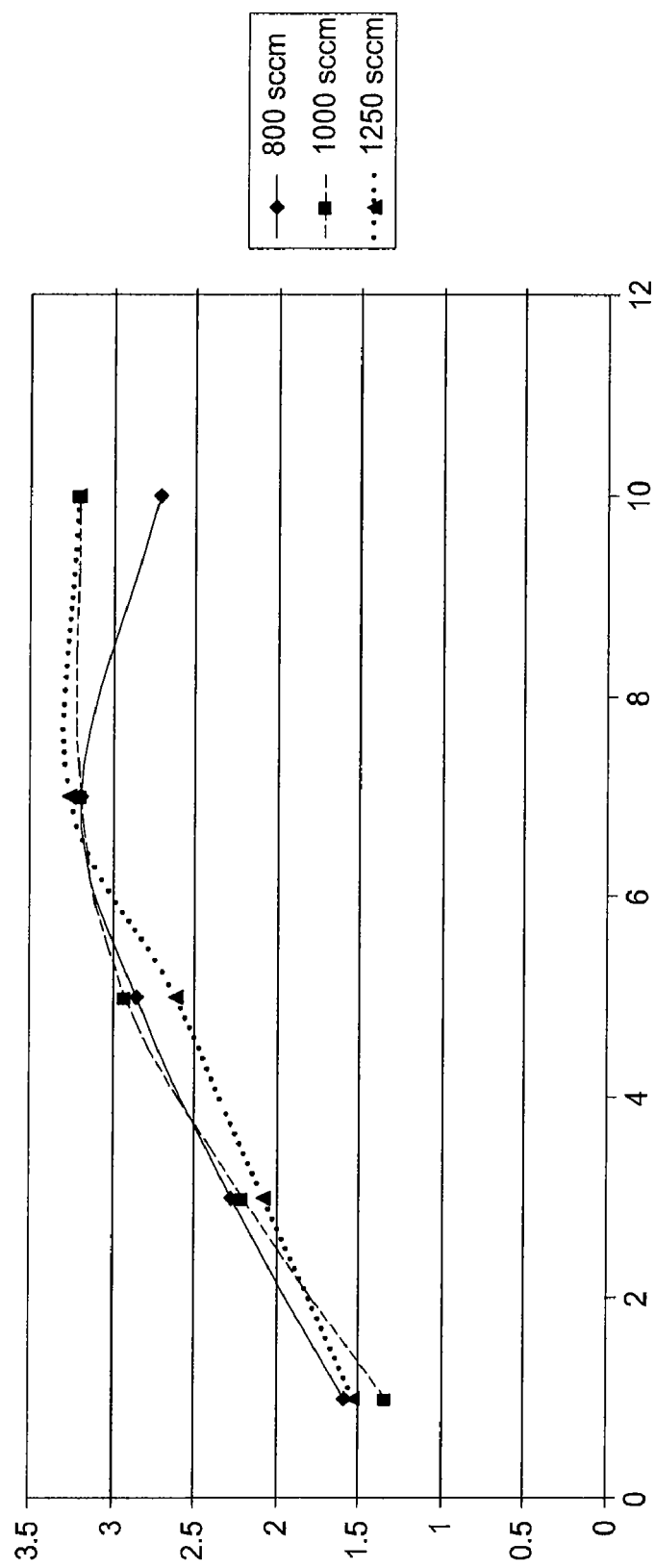

FIGS. 7A-7C illustrate the crystallinity test results from the various samples listed in and processed according to Table 2. As shown in FIG. 7A, the 600×720 mm test substrates where measured for crystallinity from the center to one corner of the sample along 12 positions equally spaced apart. FIG. 7B is a graph of the crystallinity of the xy '908A5 sample showing the ratio of crystalline silicon to amorphous silicon as previously discussed. Only a small portion near the center of the substrate had an amorphous silicon region. Microcrystalline silicon formed over most of the substrate. Overall, microcrystalline silicon deposition was generally uniform over the whole area.

FIG. 7C is a graph of the measured crystallinity of the ×42, ×43, and ×44 samples processed according to Table 2. During processing of these samples, the processing gas flow cycle was performed 15 times and had the process gas flow on for 1 second out of 50 or 61 seconds total cycle time depending on the sample. Thus, the silane gas would flow into the process volume for 1 second and then cease flow for 49 or 60 seconds depending on the cycle. Gas ions formed in the plasma would then back-flow into the diffuser region during the 49 or 60 seconds remaining in the cycle. As the cycle repeats, new silane gas would flow into the diffuser region and mix with the gas ions, and the mixture of silane gas and gas ions would reflow into the process volume feeding the plasma already maintained. The silane gas flow rates were also varied depending on the cycle.

In these samples, the microcrystallinity of silicon was largely uniform with an even smaller central region of the substrate having amorphous silicon film than the xy '908A5 sample. Additionally, thickness uniformity was better as the process gas flow rate increased and cycled according to embodiments of the invention.

High power and high pressure process parameters without using embodiments of the invention generally does not uniformly create microcrystalline, likely due to powder generation especially when using pure silane. However, high power and high pressure coupled with the cycling of process gas according to embodiments of the invention to back-flow gas ions into the diffuser region and mix with the process gas in the diffuser region, helps increase the deposition rate and uniformity of microcrystalline silicon. It is believed that when using pure silane as the processing gas, no pure silane directly interacts with the plasma which helps prevent powder formation. Thus, according to embodiments of the invention, the gas composition introduced into the process volume and plasma area is different from the processing gas composition.

While the foregoing is directed to embodiments of the present invention, other and further embodiments of the invention may be devised without departing from the basic scope thereof, and the scope thereof is determined by the claims that follow.

The invention claimed is:

1. A method of forming a microcrystalline silicon layer on a substrate in a deposition chamber, comprising:
   flowing a processing gas into a diffuser region between a backing plate and a showerhead of the deposition chamber;
   flowing the processing gas through a plurality of holes in the showerhead and into a process volume between the showerhead and a substrate support in the deposition chamber;
   igniting a plasma in the process volume;
   back-flowing gas ions formed in the plasma through the plurality of holes in the showerhead and into the diffuser region;
   mixing the gas ions and the processing gas in the diffuser region;
   re-flowing the gas ions and processing gas through the plurality of holes in the showerhead and into the process volume; and
   depositing a microcrystalline silicon layer on the substrate.

2. The method of claim 1, wherein the method further comprises:
   cycling the flow of processing gas, the cycling comprising:
      flowing the processing gas for between about 1 and 15 seconds after igniting the plasma; and
      stopping the flow of processing gas for between about 50 and 65 seconds.

3. The method of claim 2, wherein the cycling occurs between 10 and 20 times.

4. The method of claim 1, wherein back-flowing the gas ions further comprises:
   decreasing the flow of processing gas sufficiently to allow the gas ions to back-flow through the plurality of holes in the showerhead and into the diffuser region.

5. The method of claim 2, further comprising:
initiating the deposition chamber by flowing $H_2$ into the process volume.

6. The method of claim 5, wherein initiating the deposition chamber occurs either before or during a first cycle.

7. The method of claim 1, wherein the processing gas comprises a mixture of gases.

8. The method of claim 1, wherein the processing gas does not include a carrier gas.

9. The method of claim 1, wherein the processing gas consists of silane.

10. The method of claim 1, wherein the processing gas comprises silane and $H_2$.

11. The method of claim 1, wherein the processing gas is at a flow rate of between 750 and 1300 sccm.

12. The method of claim 1, wherein igniting the plasma further comprises:
applying an RF power to the deposition chamber at about 5000 W.

13. The method of claim 1, wherein the method further comprises:
pressurizing the chamber to between 6 and 10 Torr.

14. A method of forming a microcrystalline silicon layer on a substrate in a deposition chamber, comprising:
flowing a silane gas into a diffuser region between a backing plate and a showerhead of the deposition chamber;
flowing the silane gas through a plurality of holes in the showerhead and into a process volume between the showerhead and a substrate support in the deposition chamber;
igniting a plasma in the process volume;
cycling the flow of silane gas, the cycling comprising:
flowing the silane gas for between about 1 and 15 seconds after igniting the plasma; and
back-flowing gas ions formed in the plasma through the plurality of holes in the showerhead and into the diffuser region by stopping the flow of silane gas for between about 50 and 65 seconds;
mixing the gas ions and the silane gas in the diffuser region;
re-flowing the gas ions and silane gas through the plurality of holes in the showerhead and into the process volume by repeating the cycle; and
depositing a microcrystalline silicon layer on the substrate.

15. The method of claim 14, wherein the cycling occurs between 10 and 20 times.

16. The method of claim 14, further comprising:
initiating the deposition chamber by flowing $H_2$ into the process volume.

17. The method of claim 15, wherein initiating the deposition chamber occurs either before or during the first cycle of flowing the silane gas.

18. The method of claim 14, wherein the silane gas is at a flow rate of between 750 and 1300 sccm.

19. The method of claim 14, wherein igniting the plasma further comprises applying an RF power to the deposition chamber at about 5000 W.

20. The method of claim 14, wherein the method further comprises pressurizing the deposition chamber to between 6 and 10 Torr.

* * * * *

UNITED STATES PATENT AND TRADEMARK OFFICE
CERTIFICATE OF CORRECTION

PATENT NO.        : 8,026,157 B2                                    Page 1 of 1
APPLICATION NO.   : 12/553007
DATED             : September 27, 2011
INVENTOR(S)       : Yang et al.

It is certified that error appears in the above-identified patent and that said Letters Patent is hereby corrected as shown below:

Column 1, Line 43, please delete "(pc-Si)" and insert --($\mu$c-Si)-- therefor.

Signed and Sealed this
Third Day of January, 2012

David J. Kappos
*Director of the United States Patent and Trademark Office*